United States Patent
Machida et al.

(10) Patent No.: US 8,558,587 B2
(45) Date of Patent: Oct. 15, 2013

(54) GATE DRIVER

(75) Inventors: Osamu Machida, Niiza (JP); Shinji Sato, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 0 days.

(21) Appl. No.: 13/482,384

(22) Filed: May 29, 2012

(65) Prior Publication Data

US 2012/0306545 A1 Dec. 6, 2012

(30) Foreign Application Priority Data

May 31, 2011 (JP) ................................ P2011-121616
Oct. 17, 2011 (JP) ................................ P2011-227695

(51) Int. Cl.
*H03K 3/00* (2006.01)

(52) U.S. Cl.
USPC ............................ 327/109; 327/419; 327/427

(58) Field of Classification Search
USPC ................. 327/108–109, 309, 313, 419, 427, 327/430–432, 434
See application file for complete search history.

(56) References Cited

U.S. PATENT DOCUMENTS

| | | | | |
|---|---|---|---|---|
| 5,936,360 A * | 8/1999 | Kaneko | ......................... | 315/307 |
| 6,661,276 B1 * | 12/2003 | Chang | ........................... | 327/427 |
| 7,030,679 B2 * | 4/2006 | Hopkins | ....................... | 327/407 |
| 7,116,153 B2 * | 10/2006 | Pai | ................................ | 327/430 |
| 2012/0139589 A1 | 6/2012 | Machida et al. | | |

FOREIGN PATENT DOCUMENTS

JP      2010-51165      3/2010

* cited by examiner

*Primary Examiner* — An Luu
(74) *Attorney, Agent, or Firm* — Oblon, Spivak, McClelland, Maier & Neustadt, L.L.P.

(57) ABSTRACT

A gate driver turns on/off a switching element Q1 by applying a control signal from a controller to a gate of the switching element. The switching element has the gate, a drain, and a source and contains a wide-bandgap semiconductor. The gate driver includes a parallel circuit that includes a first capacitor C1 and a first resistor R1 and is connected between the controller and the gate of the switching element and a short-circuit unit S4 that is connected between the gate and source of the switching element and short-circuits the gate and source of the switching element after a delay from an OFF pulse of the control signal.

7 Claims, 9 Drawing Sheets

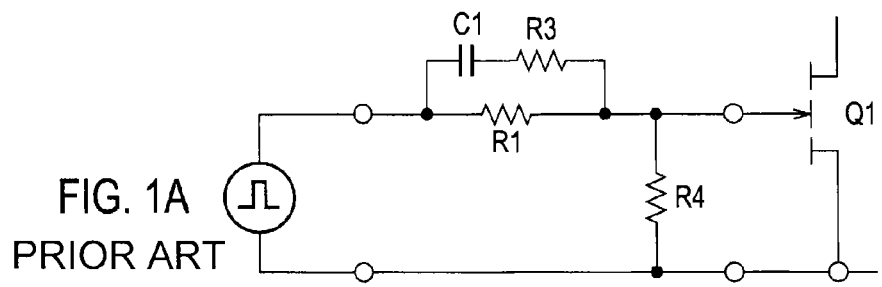
FIG. 1A
PRIOR ART
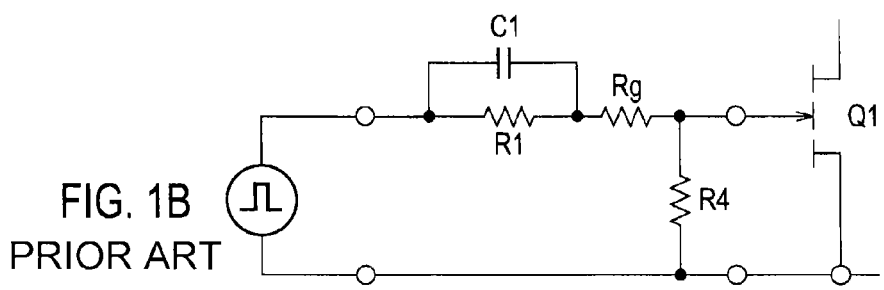
FIG. 1B
PRIOR ART
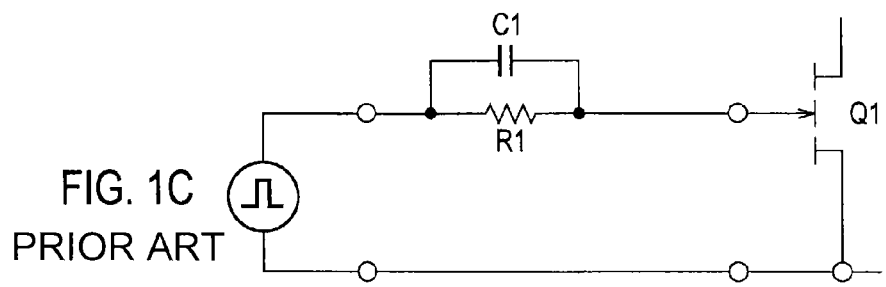
FIG. 1C
PRIOR ART
FIG. 2
PRIOR ART
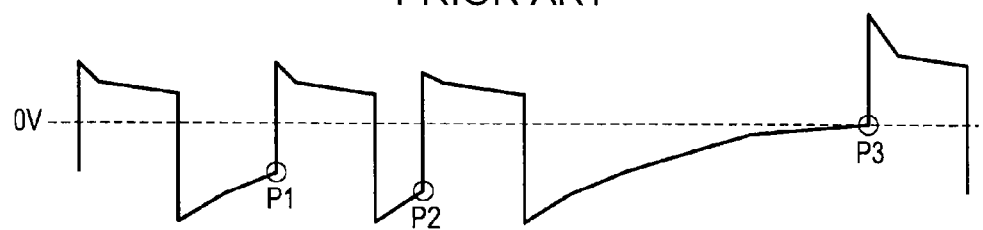

US 8,558,587 B2

GATE DRIVER

BACKGROUND OF THE INVENTION

1. Field of the Invention

The present invention relates to a gate driver for driving the gate of a switching element.

2. Description of Related Art

A GaN device has great potential compared with an existing Si device, and therefore, is anticipated for practical use. A standard GaN FET is a normally-on device, and therefore, needs a negative power source.

On the other hand, a normally-off GaN FET is very difficult to produce. The normally-off GaN FET has a threshold voltage of about +1 V, which is very low compared with that of an existing Si MOSFET. This is a first problem related to the normally-off GaN FET.

The normally-off GaN FET has an uninsulated gate-source configuration, unlike the Si MOSFET having an insulated gate-source configuration. The normally-off GaN FET, therefore, has a diode characteristic to pass a large current when a large voltage is applied thereto. Due to this, the normally-off GaN FET easily breaks if a large voltage is applied to the gate thereof. This is a second problem related to the normally-off GaN FET.

Due to these problems, a gate driver for the Si MOSFET (IGBT, or Insulated Gate Bipolar Transistor) is not applicable as it is to the normally-off GaN FET. Namely, the normally-off GaN FET needs an exclusive gate driver.

In connection with the first problem, a turn-off time of the normally-off GaN FET will be shortened if a voltage sufficiently lower than the threshold voltage of about +1 V, preferably a negative voltage lower than 0 V, is applied to the gate of the normally-off GaN FET. For this, the normally-off GaN FET needs a negative power source. The negative power source, however, is undesirable although it is necessary for realizing a normally-off state.

In connection with the second problem, a turn-on time of the normally-off GaN FET will be shortened if a voltage sufficiently higher than the threshold voltage is applied to the gate of the normally-off GaN FET. More precisely, shortening the turn-on time needs an instantaneous large current and creating the large current is properly achievable with a higher voltage. It is unable, however, to apply a high voltage such as 10 V used for the Si MOSFET to the gate of the normally-off GaN FET because it breaks the normally-off GaN FET.

To solve both the first and second problems, a related art illustrated in FIGS. 1A to 1C arranges a parallel CR circuit including a capacitor C1 and a resistor R1 at a location where a gate resistor of a MOSFET driver is generally arranged.

A similar related art is disclosed in, for example, Japanese Unexamined Patent Application Publication No. 2010-51165.

SUMMARY OF THE INVENTION

The technique of the related arts, however, varies the turn-on switching characteristic (switching time) of the switching element in response to a change in the switching frequency or duty ratio of the switching element. This is because, as illustrated in FIG. 2, the change in the switching frequency or duty ratio leads to a change in a negative voltage value (P1, P2, P3) just before turning on the switching element.

During an OFF period, a negative voltage is applied to the gate of the switching element, to stabilize the OFF state of the switching element. However, the GaN FET having no body diode causes a large voltage drop and power loss (conduction loss) during a regenerative period as illustrated in the third quadrant of FIG. 3.

If the switching frequency and duty ratio of the switching element are limited within proper ranges, the above-mentioned two problems will be solved by properly choosing the resistor and capacitor of the parallel CR circuit and by carrying out the regenerative and turn-on operations after zeroing the gate voltage of the switching element. This technique, however, is achievable only under the limited conditions and may easily cause a malfunction due to noise because of the low threshold voltage.

The present invention provides a gate driver capable of stably turning on a switching element without varying a turn-on switching characteristic or causing a power loss.

According to an aspect of the present invention, the gate driver turns on/off the switching element by applying a control signal from a controller to a gate of the switching element. The switching element has the gate, a drain, and a source and contains a wide-bandgap semiconductor. The gate driver includes a parallel circuit that includes a first capacitor and a first resistor and is connected between the controller and the gate of the switching element and a short-circuit unit that is connected between the gate and source of the switching element and short-circuits the gate and source of the switching element after a delay from an OFF pulse of the control signal.

BRIEF DESCRIPTION OF THE DRAWINGS

FIGS. 1A to 1C are circuit diagrams illustrating examples of a gate driver according to a related art;

FIG. 2 illustrates the turn-on characteristic of a switching element driven by the gate driver of the related art, the turn-on characteristic varying depending on a switching frequency and duty ratio;

DESCRIPTION OF PREFERRED EMBODIMENTS

Gate drivers according to embodiments of the present invention will be explained in detail with reference to the drawings.

Embodiment 1

Figure 3:
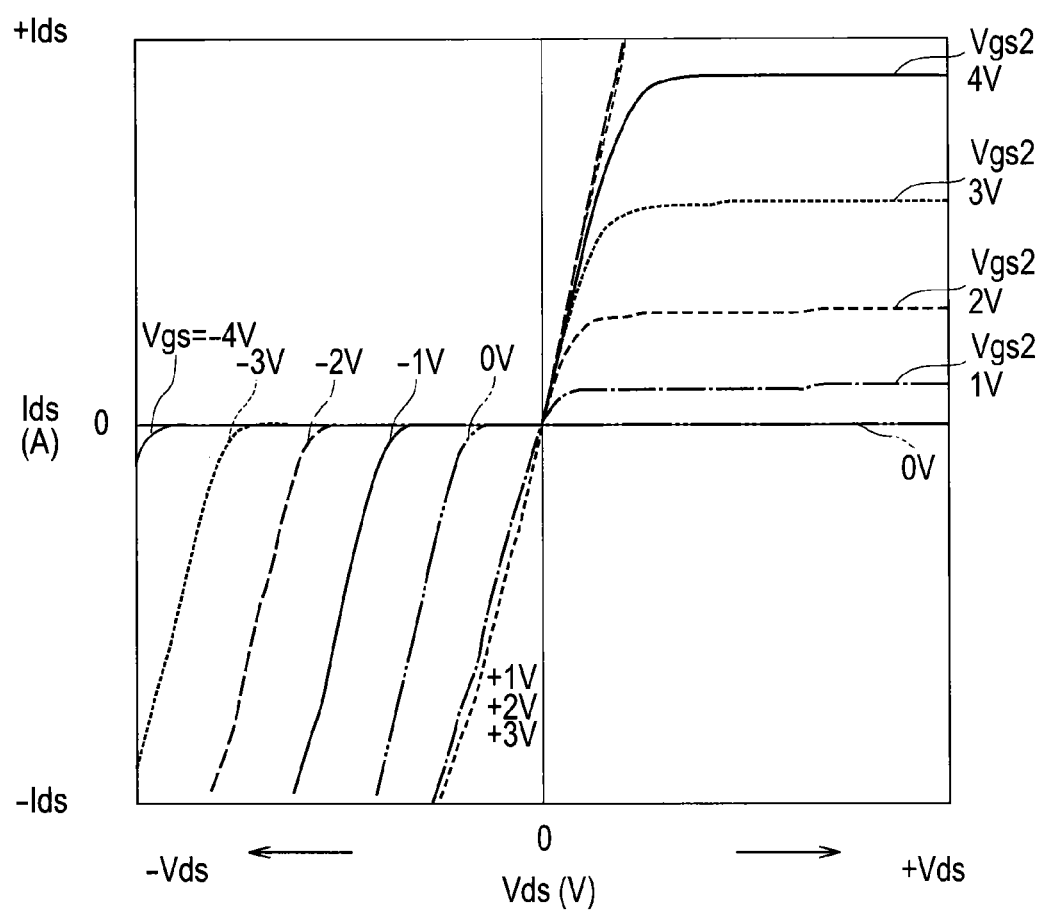
FIG. 3 is a graph illustrating the voltage-current characteristics of a GaN FET.
Figure 4A:
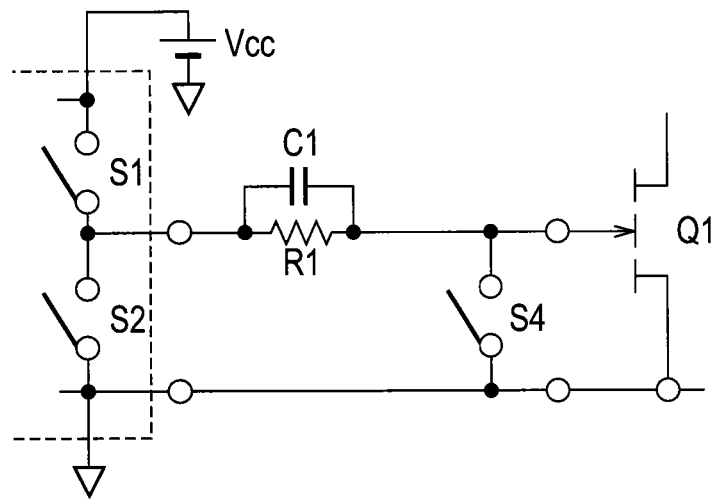
FIG. 4A is a circuit diagram illustrating a gate driver according to Embodiment 1 of the present invention.
Figure 4B:
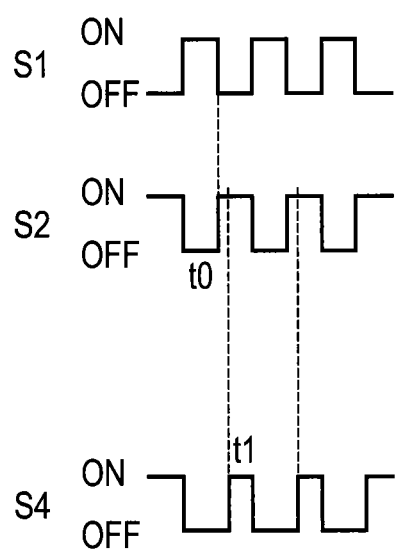
FIG. 4B illustrates an operation sequence of the gate driver of FIG. 4A.

FIG. 4A is a circuit diagram illustrating a gate driver according to Embodiment 1 of the present invention and FIG.

4B illustrates an operation sequence of the gate driver of FIG. 4A. In FIG. 4A, both ends of a power source Vcc are connected to a series circuit including switches S1 and S2. The switches S1 and S2 are alternately turned on and off, to generate a pulse signal. The switches S1 and S2 correspond to the controller stipulated in the claims and the pulse signal to the control signal stipulated in the claims.

A switching element Q1 is a GaN FET and has a gate, drain, and source. Connected between the gate of the switching element Q1 and a connection point of the switches S1 and S2 is a parallel CR circuit including a capacitor C1 and a resistor R1.

The pulse signal is applied through the parallel CR circuit to the gate of the switching element Q1.

According to Embodiment 1, a switch S4 is arranged between the gate and source of the switching element Q1. The switch S4 discharges the capacitor C1 of the parallel CR circuit and is normally in an OFF state. The switch S4 is turned on at certain timing during an OFF period of the switching element Q1. The switch S4 corresponds to the short-circuit unit stipulated in the claims.

When turning on the switching element Q1, the parallel CR circuit carries out a high-speed switching operation, and thereafter, a gate overcurrent protection operation. When the switching element Q1 is in a steady ON state, the capacitor C1 is charged with a voltage difference between an ON output voltage Vcc from the controller and a gate-source voltage $Vf\_gs$, i.e., a forward voltage drop of an equivalent diode between the gate and source of the switching element Q1.

When turning off the switching element Q1, a negative voltage is applied from the capacitor C1 to the gate of the switching element Q1, to turn off the switching element Q1 at high speed.

During an OFF period of the switching element Q1, the capacitor C1 discharges according to a time constant determined by the capacitor C1 and resistor R1. If the switching element Q1 starts to be turned on before the capacitor C1 is completely discharged, a voltage at the gate of the switching element Q1 will be negative. The negative voltage just before turning on the switching element Q1 varies depending on the switching frequency and duty ratio of the switching element Q1, thereby changing the switching characteristic of the switching element Q1. In addition, the negative gate voltage increases a voltage drop in a regenerative operation, thereby increasing a power loss.

To avoid these problems, Embodiment 1 turns on the switch S4 at time t1 after a certain time from time t0 at which the switch S1 is turned off to turn off the switching element Q1. When the switch S4 turns on, the capacitor C1 quickly discharges not only through the resistor R1 but also through the switch S4.

If the impedance of the switch S1 is sufficiently lower than that of the resistor R1, the capacitor C1 is completely discharged in a very short time during the OFF period of the switching element Q1. Namely, the capacitor C1 is completely discharged before turning on the switching element Q1, and therefore, the switching element Q1 is stably turned on without regard to the switching frequency and duty ratio thereof.

The switch S4 is also put in an ON state during a regenerative operation, to stably zero the gate-source voltage of the switching element Q1. This makes the regenerative operation resistive against noise and reduces a power loss.

Embodiment 2

Figure 5:
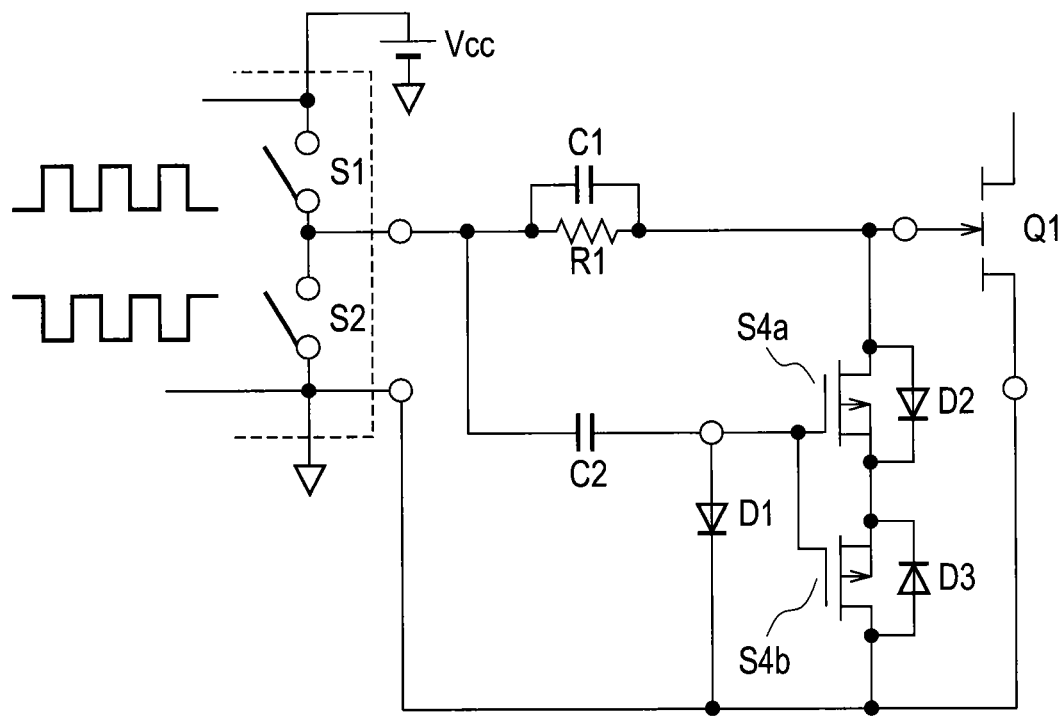
FIG. 5 is a circuit diagram illustrating a gate driver according to Embodiment 2 of the present invention.

FIG. 5 is a circuit diagram illustrating a gate driver according to Embodiment 2 of the present invention. Embodiment 2 employs, as a short-circuit unit, a bidirectional switch (S4a, S4b) instead of the switch S4 of Embodiment 1. The bidirectional switch (S4a, S4b) is made of n-type or p-type MOSFETs whose sources are connected to each other and whose gates are connected to each other. The bidirectional switch (S4a, S4b) is connected between the gate and source of a switching element Q1. When a certain time elapses after turning off the switching element Q1, a signal is applied to turn on the bidirectional switch (S4a, S4b), to quickly discharge a capacitor C1 of a parallel CR circuit. When carrying out a regenerative operation, it is preferable that the bidirectional switch (S4a, S4b) is kept in an ON state during an OFF period of the switching element Q1.

It is troublesome for an existing controller to generate a control signal for the bidirectional switch (S4a, S4b). If the bidirectional switch S4a+S4b is made of p-type MOSFETs, a control signal for the bidirectional switch will easily be generated by adding a simple circuit. This will be explained.

It is assumed that a controller including switches S1 and S2 provides the bidirectional switch S4a+S4b with an output voltage of about 0 V to 12 V, which is a standard driving voltage for MOSFETs. Even if the lower value of 0 V becomes negative or the higher value of 12 V increases to about 20 V, the below-mentioned circuit will work.

In FIG. 5, a capacitor C2 is connected between the gate of the bidirectional switch S4a+S4b and an output of the controller. A diode D1 (or a series circuit including the diode D1 and a resistor) is connected between the gate of the bidirectional switch S4a+S4b and a negative output of the controller and a source of the switching element Q1.

The diode D1 and capacitor C2 connected to the gate of the bidirectional switch (S4a, S4b) clamp a gate voltage of the bidirectional switch (S4a, S4b) to +0.6 V or −11.4 V.

Here, the voltage of 0.6 V is a forward voltage Vf of the diode D1. In response to the clamped voltages, the bidirectional switch S4a+S4b made of p-type MOSFETs turns on and off in synchronization with the switch S2. The signal for driving the bidirectional switch (S4a, S4b) is generated according to an output from the switch S2, and therefore, the bidirectional switch S4a+S4b slightly delays behind the switch S2.

According to a power source voltage Vcc, the forward voltage Vf (D1) of the diode D1, a gate threshold voltage Vth (S4a) of the switch S4a, and a forward voltage Vf (D3) of a diode D3 connected in parallel with the switch S4b, the switch S4a turns on when the following condition is satisfied:

$$Vcc - Vf(D1) > |Vth(S4a)| + Vf(D3) \quad (1).$$

The gate voltage of the switch S4a is negative, and therefore, the expression (1) uses an absolute value of the gate voltage.

When the switching element Q1 is turned off, a negative voltage is applied to the switching element Q1 due to an effect of the parallel CR circuit, and just after that, the bidirectional switch (S4a, S4b) turns on to quickly discharge the capacitor C1 of the parallel CR circuit and zero the gate voltage of the switching element Q1.

During the OFF period of the switching element Q1, the bidirectional switch (S4a, S4b) keeps the ON state, to realize a stable regenerative operation of the switching element Q1. When the switching element Q1 turns on thereafter, the gate voltage of the bidirectional switch (S4a, S4b) becomes +0.6 V to turn off the bidirectional switch (S4a, S4b).

Figure 6:
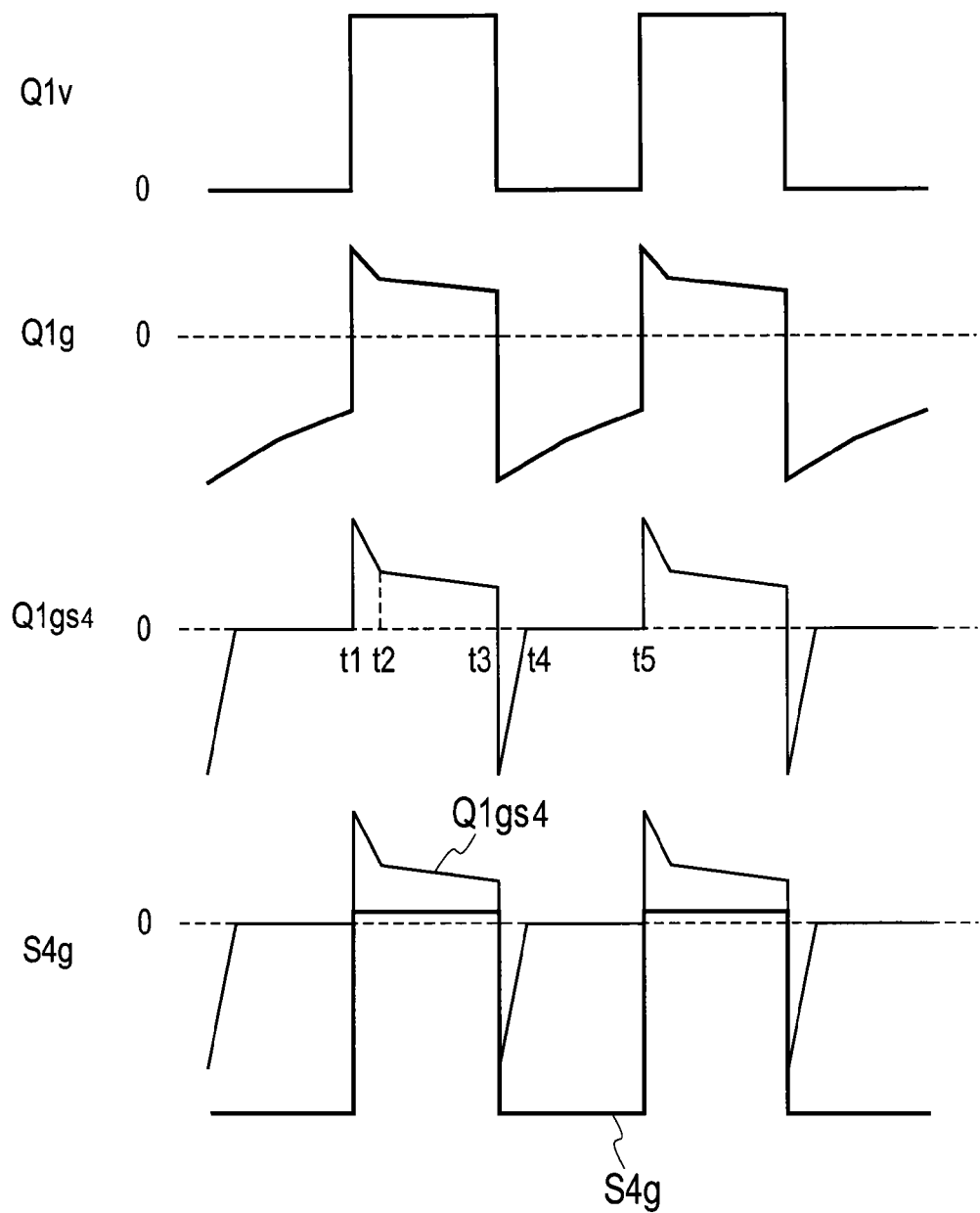
FIG. 6 illustrates operating waveforms of the gate driver of FIG. 5.

FIG. 6 illustrates operating waveforms of the gate driver according to Embodiment 2. In FIG. 6, Q1v is an output from the controller, Q1g is a gate waveform of the switching element Q1 when the bidirectional switch (S4a, S4b) is not provided, Q1gs4 is a gate waveform of the switching element Q1 when the bidirectional switch (S4a, S4b) is provided, and S4g is a gate waveform of the bidirectional switch (S4a, S4b) of p-type MOSFETs with the output from the controller being clamped by the diode D1 and capacitor C2 connected to the gate of the bidirectional switch (S4a, S4b).

Embodiment 3

Figure 7:
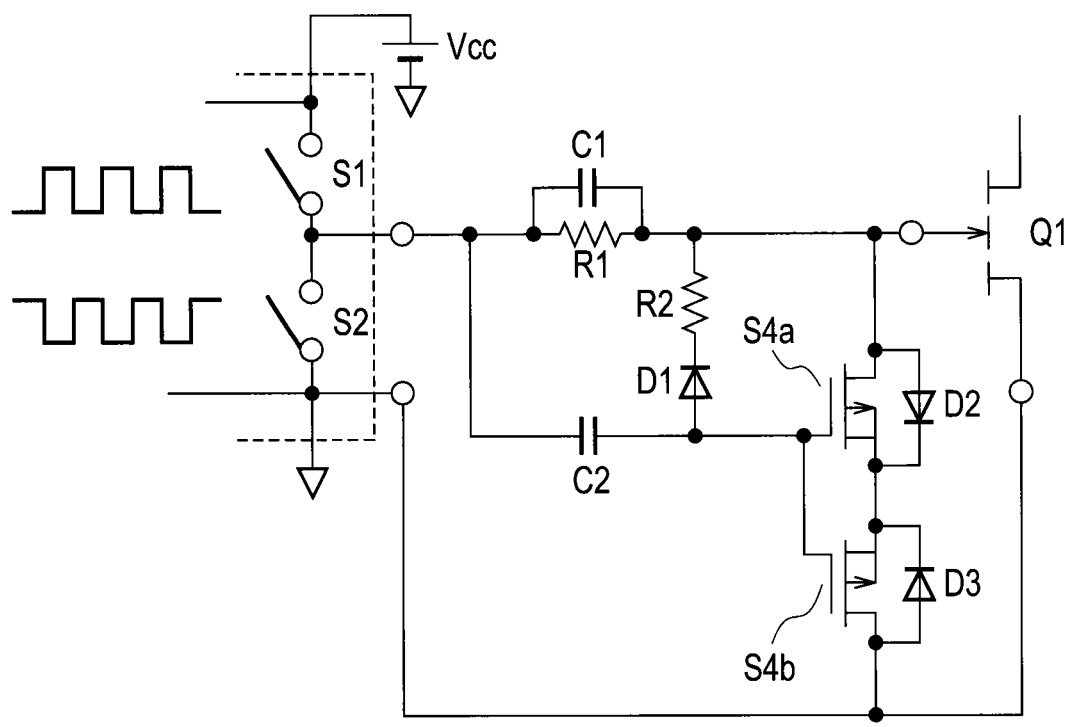
FIG. 7 is a circuit diagram illustrating a gate driver according to Embodiment 3 of the present invention.

FIG. 7 is a circuit diagram illustrating a gate driver according to Embodiment 3. In FIG. 7, a capacitor C2 is connected between the gate of a bidirectional switch (S4a, S4b) and an output of a controller including switches S1 and S2. A series circuit including a diode D1 and a resistor R2 is connected between the gate of the bidirectional switch (S4a, S4b) and the gate of a switching element Q1.

When the switching element Q1 is turned off, a negative voltage is applied to the switching element Q1 due to an effect of a parallel CR circuit including a capacitor C1 and a resistor R1. According to a time constant determined by the resistor R2 and capacitor C2 connected to the gate of the bidirectional switch (S4a, S4b), a gate voltage of the bidirectional switch (S4a, S4b) gradually increases its negative value.

When the gate voltage of the switching element Q1 is negative, a body diode D3 of the switch S4b of the bidirectional switch (S4a, S4b) becomes ON. When the gate voltage of the bidirectional switch (S4a, S4b), i.e., the gate voltage of the switch S4a exceeds the sum of a threshold voltage of the switch S4a and a forward voltage Vf of the body diode D3 of the switch S4b, the switch S4a, i.e., the bidirectional switch (S4a, S4b) turns on to quickly discharge the capacitor C1 of the parallel CR circuit and zero the gate voltage of the switching element Q1.

The switch S4a, i.e., the bidirectional switch (S4a, S4b) turns on if a gate voltage VS4g (negative), i.e., a charge voltage of the capacitor C2 and a gate threshold voltage Vth(S4a) of the switch S4a satisfy the following condition:

$$|VS4g| > |Vth(S4a)| + Vf(D3) \quad (2).$$

The gate of the bidirectional switch (S4a, S4b) is connected to the diode D1 that is oriented to block the discharging of the capacitor C2 that applies the negative gate voltage to the bidirectional switch (S4a, S4b). Accordingly, the voltage across the capacitor C2 is unchanged. Namely, the bidirectional switch (S4a, S4b) keeps the ON state, to realize a stable regenerative operation of the switching element Q1.

When the switching element Q1 is turned on thereafter, the potential of the capacitor C2 connected to the gate of the bidirectional switch (S4a, S4b) is changed to a positive voltage side, to apply a positive voltage to the gate of the bidirectional switch (S4a, S4b) to turn off the bidirectional switch (S4a, S4b). Then, the capacitor C2 is charged, the gate voltage of the bidirectional switch (S4a, S4b) becomes substantially equal to the gate voltage of the switching element Q1, and the bidirectional switch (S4a, S4b) is in the OFF state.

Compared with Embodiment 2, Embodiment 3 is lower in the absolute value of an ON-time gate voltage of the bidirectional switch (S4a, S4b), to reduce an influence of the bidirectional switch (S4a, S4b) on a succeeding ON operation of the switching element Q1.

In addition, the gate voltage of the bidirectional switch (S4a, S4b) is positive when the switching element Q1 is ON, and therefore, the bidirectional switch (S4a, S4b) according to Embodiment 3 hardly turns on erroneously.

Figure 8:
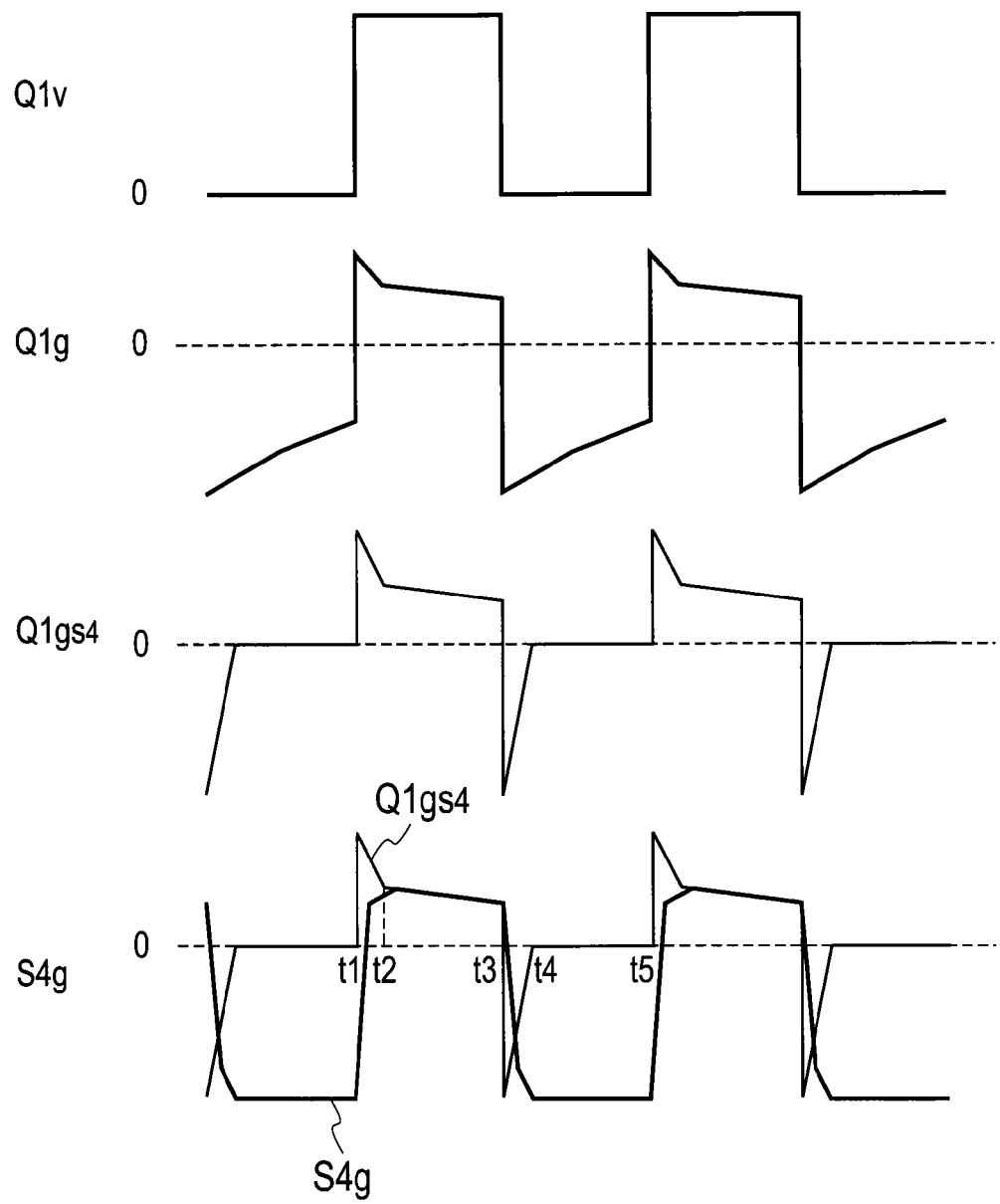
FIG. 8 illustrates operating waveforms of the gate driver of FIG. 7.

FIG. 8 illustrates operating waveforms of the gate driver according to Embodiment 3. In FIG. 8, Q1v is an output from the controller, Q1g is a gate waveform of the switching element Q1 when the bidirectional switch (S4a, S4b) is not provided, Q1gs4 is a gate waveform of the switching element Q1 when the bidirectional switch (S4a, S4b) is provided, S4g is a gate waveform of the bidirectional switch (S4a, S4b) of p-type MOSFETs, the gate waveform S4g of the bidirectional switch (S4a, S4b) falling behind the gate waveform Q1gs4 of the switching element Q1 due to a delay determined by a time constant of the resistor R2 and capacitor C2 connected to the gate of the bidirectional switch (S4a, S4b), and when falling to a certain value, the bidirectional switch (S4a, S4b) turns on.

Embodiment 4

Figure 9:
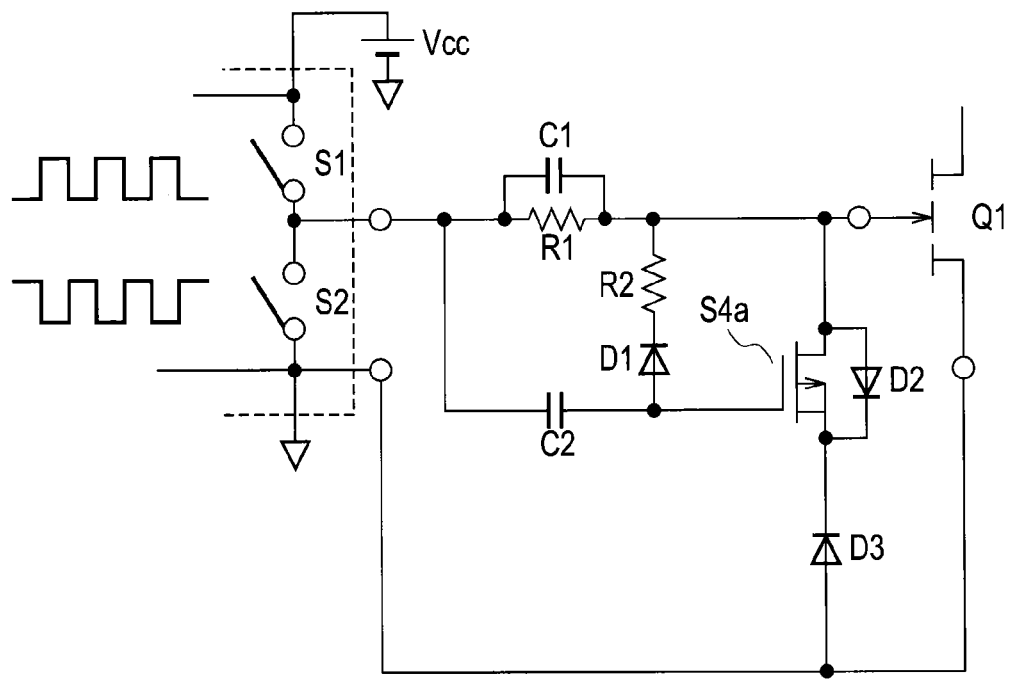
FIG. 9 is a circuit diagram illustrating a gate driver according to Embodiment 4 of the present invention.

FIG. 9 is a circuit diagram illustrating a gate driver according to Embodiment 4 of the present invention. Embodiment 4 connects, instead of the bidirectional switch (S4a, S4b) of Embodiment 3, a reverse blocking switch that is a series circuit including a p-type MOSFET S4a and a diode D3 between the gate and source of a switching element Q1. An anode of the diode D3 is connected to the source of the switching element Q1 and a drain of the p-type MOSFET S4a is connected to the gate of the switching element Q1.

The reverse blocking switch of Embodiment 4 provides the same effect as the bidirectional switch (S4a, S4b) of Embodiment 3. To stably maintain an OFF state of the switching element Q1, it is preferable that the diode D3 of the reverse blocking switch is a diode having a low forward voltage Vf, such as a Schottky barrier diode (SBD).

Figure 10:
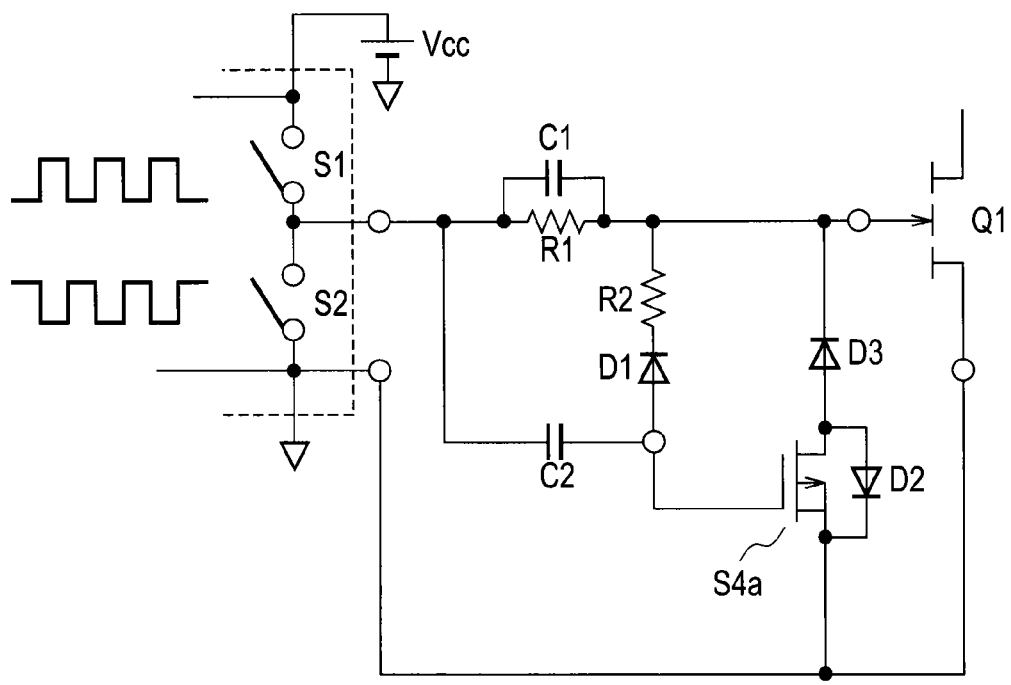
FIG. 10 is a circuit diagram illustrating a gate driver according to a modification of Embodiment 4.

The gate driver of Embodiment 4 illustrated in FIG. 9 may be modified as illustrated in FIG. 10. In FIG. 10, a cathode of the diode D3 is connected to the gate of the switching element Q1 and the source of the p-type MOSFET S4a is connected to the source of the switching element Q1. This modification provides the same effect as Embodiment 3.

If the additional switch (S4, S4a) connected between the gate and source of the switching element Q1 is a p-type or an-type MOSFET alone, a current passes through a body diode of the switching element Q1 to set the gate voltage of the switch element Q1 to 0.7 V, so that the switching element Q1 is inoperative.

Also, it is not preferable to form the additional switch with a single bipolar transistor because the bipolar transistor generally has no reverse blocking ability. If the reverse blocking ability is ensured, the bipolar transistor is adoptable as the additional switch.

Embodiment 5

Figure 11:
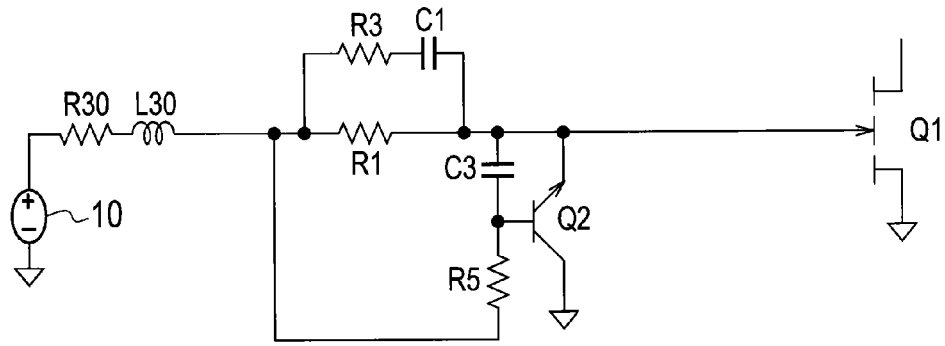
FIG. 11 is a circuit diagram illustrating a gate driver according to Embodiment 5 of the present invention.

FIG. 11 is a circuit diagram illustrating a gate driver according to Embodiment 5 of the present invention. In FIG. 11, a controller 10 (corresponding to the controller as stipulated in the claims) outputs a pulse signal having levels of 0 V and +10 V. The controller 10 involves a wiring impedance including a resistor R30 and an inductance L30 connected to a first end of a resistor R1 and a first end of a resistor R3.

Both ends of the resistor R1 are connected in parallel with a series circuit including the resistor R3 and a capacitor C1. The resistors R1 and R3 and capacitor C1 form a speed-up circuit. A second end of the resistor R1 is connected to a first end of a capacitor C3, an emitter of an npn transistor Q2, and a gate of the switching element Q1.

A second end of the capacitor C3 is connected to a first end of a resistor R5 and a base of the npn transistor Q2. A second end of the resistor R5 is connected to the first end of the resistor R1 and the first end of the resistor R3. A collector of the npn transistor Q2 is connected to a source of the switching element Q1. The npn transistor Q2, capacitor C3, and resistor R5 form a short-circuit unit.

Figure 12:
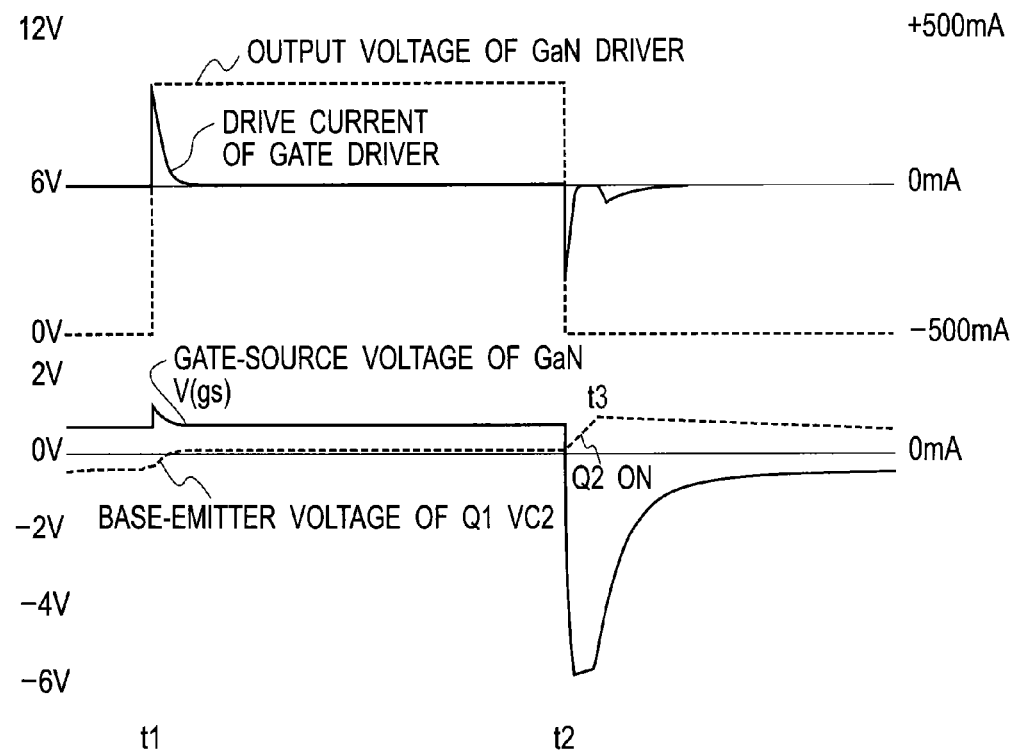
FIG. 12 illustrates operating waveforms of the gate driver of FIG. 11.

Operation of the gate driver according to Embodiment 5 will be explained in detail with reference to the timing chart of FIG. 12.

At time t1, the controller 10 outputs a control signal of +10 V to pass a gate driving current through the resistor R30 and inductance L30. The control signal is applied through the resistors R1 and R3 and capacitor C1 to the gate of the switching element Q1, to turn on the switching element Q1. At this time, a base-emitter voltage of the npn transistor Q2 becomes nearly zero.

At time t2, the controller 10 applies a control signal of 0 V to the gate of the switching element Q1, to turn off the switching element Q1. The speed-up circuit including the resistors R1 and R3 and capacitor C1 drops a gate-source voltage V(gs) of the switching element Q1 to a value lower than zero volts.

As a result, a current passes through the inductance L30, the resistor R5 and the capacitor C3. Accordingly, a voltage VC2 across the capacitor C3, i.e., the base-emitter voltage of the npn transistor Q2 gradually increases from time t2 to t3.

When the voltage VC2 across the capacitor C3 exceeds a forward voltage VF between the base and emitter of the npn transistor Q2, the npn transistor Q2 turns on to short-circuit the gate and source of the switching element Q1. As a result, the gate-source voltage V(gs) of the switching element Q1 becomes nearly zero.

In this way, a negative bias is secured for a predetermined time at the gate of the switching element Q1 at the time of turning off the switching element Q1, and after a certain time from the turning-off of the switching element Q1, the gate-source voltage V(gs) of the switching element Q1 is nearly zeroed.

Although the present invention has been explained in connection with Embodiments 1 to 5, the present invention is not limited to these embodiments. Also, the combination of a CMOS device and a bipolar transistor explained in connection with, for example, Embodiment 5 does not limit the present invention. Any combination is allowed for the present invention if the combination provides proper operation timing.

Switching elements to which the present invention is applicable are not limited to GaN FETs. The present invention is also applicable to Si and SiC elements. The present invention is also applicable to devices whose threshold voltages are low and whose behaviors are like JFETs (junction FETs) having uninsulated gates.

According to the present invention, the short-circuit unit short-circuits the gate and source of the switching element after a certain delay from an OFF pulse of a control signal. Accordingly, the first capacitor is discharged not only through the first resistor but also through the short-circuit unit. As a result, the switching element is stably turned on without varying the switching characteristic thereof or causing a power loss.

This application claims benefit of priority under 35 USC §119 to Japanese Patent Applications No. 2011-121616, filed on May 31, 2011 and No. 2011-227695, filed on Oct. 17, 2011, the entire contents of which are incorporated by reference herein.

What is claimed is:

1. A gate driver for turning on/off a switching element by applying a control signal of a controller to a gate of the switching element, the switching element having the gate, a drain, and a source and containing a wide-bandgap semiconductor, the gate driver comprising:
 a parallel circuit of a first capacitor and a first resistor being connected between the controller and the gate of the switching element; and
 a short-circuit unit connected between the gate and source of the switching element configured to shunt the gate and source of the switching element after a delay from an OFF pulse of the control signal.

2. The gate driver of claim 1, wherein the short-circuit unit is a bidirectional switch.

3. The gate driver of claim 2, wherein the bidirectional switch includes:
 a semiconductor switch having a control terminal and two main electrodes connected between the gate and source of the switching element;
 a second capacitor having a first end connected to the control terminal of the semiconductor switch and a second end connected to the controller; and
 a diode having an anode connected to the control terminal of the semiconductor switch and a cathode connected to the source of the switching element.

4. The gate driver of claim 2, wherein the bidirectional switch includes:
 a semiconductor switch having a control terminal and two main electrodes connected between the gate and source of the switching element;
 a second capacitor having a first end connected to the control terminal of the semiconductor switch and a second end connected to the controller; and
 a diode having an anode connected to the control terminal of the semiconductor switch and a cathode connected to the gate of the switching element.

5. The gate driver of claim 1, wherein the short-circuit unit is a reverse blocking switch to carry out a reverse blocking operation on an ON pulse of the control signal.

6. The gate driver of claim 5, wherein the reverse blocking switch includes:
 a series circuit including a semiconductor switch having a control terminal and two main electrodes and a diode, the two main electrodes and the diode being connected between the gate and source of the switching element;
 a second capacitor having a first end connected to the control terminal of the semiconductor switch and a second end connected to the controller; and
 a diode having an anode connected to the control terminal of the semiconductor switch and a cathode connected to the gate of the switching element.

7. The gate driver of claim 1, wherein the short-circuit unit includes:
 a transistor having a first main electrode connected to the gate of the switching element and a second main electrode connected to the source of the switching element;
 a second capacitor connected between the first main electrode of the transistor and a control terminal of the transistor; and
 a second resistor connected to the control terminal of the transistor and a signal input side of the parallel circuit.

* * * * *